(12) United States Patent
Iwai

(10) Patent No.: US 7,863,701 B2
(45) Date of Patent: Jan. 4, 2011

(54) OPTICAL SEMICONDUCTOR DEVICE AND METHOD FOR MANUFACTURING THE SAME

(75) Inventor: Takaki Iwai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/302,143

(22) PCT Filed: Apr. 3, 2007

(86) PCT No.: PCT/JP2007/057422

§ 371 (c)(1),
(2), (4) Date: Nov. 24, 2008

(87) PCT Pub. No.: WO2007/135809

PCT Pub. Date: Nov. 29, 2007

(65) Prior Publication Data

US 2009/0140367 A1      Jun. 4, 2009

(30) Foreign Application Priority Data

May 24, 2006    (JP) ............................. 2006-143986

(51) Int. Cl.
*H01L 31/00* (2006.01)
*H01L 27/14* (2006.01)

(52) U.S. Cl. ............... 257/431; 257/461; 257/E31.001; 438/57

(58) Field of Classification Search ............... 257/431, 257/461, 462, 463, E21.032, E31.001; 438/87, 438/57, 59, 80

See application file for complete search history.

(56) References Cited

U.S. PATENT DOCUMENTS 5,770,872 A    6/1998    Arai (Continued)

FOREIGN PATENT DOCUMENTS

EP    0 855 743 A    7/1998

(Continued)

OTHER PUBLICATIONS

Supplementary European Search Report issued in European Patent Application No. EP 07 74 0858 dated Nov. 11, 2009.

*Primary Examiner*—Matthew S Smith
*Assistant Examiner*—Michele Fan
(74) *Attorney, Agent, or Firm*—McDermott Will & Emery LLP

(57) ABSTRACT

An optical semiconductor device is provided with a low concentration p-type silicon substrate (1); a low dopant concentration n-type epitaxial layer (second epitaxial layer) (26); a low dopant concentration p-type anode layer (27); a high concentration n-type cathode contact layer (9); a photodiode (2) made of the anode layer (27) and the cathode contact layer (9); and an NPN transistor (3) formed on the n-type epitaxial layer (26). The anode can be substantially completely depleted in the case where the anode layer (27) has its dopant concentration peak in the vicinity of the interface between the silicon substrate (1) and the n-type epitaxial layer (26). Therefore, high speed and high light receiving sensitivity characteristics can be obtained, and further, any influence of autodoping from peripheral embedding layers can be controlled, so that a depletion layer can be stably formed in the anode. Thus, a photodiode characterized in its high speed and high light receiving sensitivity for short wavelength light and a transistor characterized in its high speed can be mounted on the same semiconductor substrate.

7 Claims, 12 Drawing Sheets

U.S. PATENT DOCUMENTS

| | | |
|---|---|---|
| 6,049,118 A | 4/2000 | Nagano |
| 6,114,740 A | 9/2000 | Takimoto et al. |
| 6,184,100 B1 | 2/2001 | Arai |
| 6,376,871 B1 * | 4/2002 | Arai .......................... 257/290 |
| 6,380,603 B1 | 4/2002 | Takimoto et al. |
| 2001/0038096 A1 | 11/2001 | Fukushima et al. |
| 2003/0168709 A1 | 9/2003 | Kashiura |
| 2007/0254398 A1 * | 11/2007 | Wakabayashi et al. ........ 438/59 |

FOREIGN PATENT DOCUMENTS

| | | |
|---|---|---|
| JP | 03-091959 | 4/1991 |
| JP | 04-082268 | 3/1992 |
| JP | 09-219534 | 8/1997 |
| JP | 09-307086 | 11/1997 |
| JP | 10-107243 | 4/1998 |
| JP | 2001-135808 | 5/2001 |
| JP | 2001-284629 | 10/2001 |
| JP | 2004-119632 | 4/2004 |
| JP | 2004-172212 A | 6/2004 |
| JP | 2005-183722 | 7/2005 |

\* cited by examiner

FIG. 8B

OPTICAL SEMICONDUCTOR DEVICE AND METHOD FOR MANUFACTURING THE SAME

RELATED APPLICATIONS

This application is the U.S. National Phase under 35 U.S.C. §371 of International Application No. PCT/JP2007/057422, filed on Apr. 3, 2007, which in turn claims the benefit of Japanese Application No. 2006-143986, filed on May 24, 2006, the disclosures of which Applications are incorporated by reference herein.

FIELD OF THE INVENTION

The present invention relates to an optical semiconductor device provided with a light receiving element and a transistor on the same substrate, and a method for manufacturing the semiconductor device.

BACKGROUND OF THE INVENTION

A light receiving element is an element used for converting an optical signal into an electrical signal, and used in various fields. In the field of optical discs such as CD (compact disc) and DVD (digital versatile disc), in particular, a light receiving element is important as a key device of an optical head device (optical pickup) which reads and writes a signal recorded on an optical disc. As a higher performance and a higher integration have been increasingly demanded in recent years, a so-called opto-electronic integrated circuit (OEIC) provided with a photo diode which is a light receiving element and other electronic elements such as a bipolar transistor, a resistance and a capacitance is being developed. It is demanded that a light receiving element characterized in its high receiving sensitivity, high speed and low noise, and a bipolar transistor characterized in its high speed and high performance be provided in the OEIC. As a recent trend, the commercialization of products such as Blu-ray Disc (BD) and HD-DVD, in which a blue semiconductor laser (wavelength of 405 nm) is used as a light source, has started in response to a demand for a larger capacity of the optical disc. Accordingly, the development of an OEIC which achieves a high speed and a high receiving sensitivity in a short wavelength region corresponding to the blue semiconductor laser is awaited.

Below is described a conventional optical semiconductor device.

FIG. 11 is a schematic sectional view of an optical semiconductor device (OEIC) having a conventional structure. In the example of the drawing is illustrated an OEIC provided with a silicon substrate as a semiconductor substrate, a double polysilicon emitter high-speed NPN transistor as a bipolar transistor and a pin photodiode as a light receiving element on a same substrate.

Referring to reference numerals shown therein, 1 denotes a low concentration p-type silicon substrate, 2 denotes a photodiode formed on the substrate 1, 3 denotes an NPN transistor formed on the silicon substrate, 4 denotes a high concentration p-type embedding layer formed on the silicon substrate 1, 5 denotes a low concentration p-type epitaxial layer formed on the p-type embedding layer 4, 6 denotes an n-type epitaxial layer formed on the p-type epitaxial layer 5, and 7 denotes a LOCOS isolation layer formed on the n-type epitaxial layer 6.

In the photodiode 2, 8 denotes a cathode layer made of the n-type epitaxial layer 6, 9 denotes a cathode contact layer formed on the cathode layer 8, 10 denotes a cathode electrode selectively formed on the cathode contact layer 9, 11 denotes a p-type anode embedding layer formed in the interface between the p-type epitaxial layer 5 and the n-type epitaxial layer 6, 12 denotes a p-type anode contact layer formed on the anode embedding layer 11, and 13 denotes an anode electrode formed on the anode contact layer 12.

In the NPN transistor 3, 14 denotes a high concentration n-type collector embedding layer formed in the interface between the p-type epitaxial layer 5 and the n-type epitaxial layer 6, 15 denotes a high concentration n-type collector contact layer selectively formed on the collector embedding layer 14, 16 denotes a collector electrode formed on the collector contact layer 15, 17 denotes a p-type base layer selectively formed in the n-type epitaxial layer 6 on the collector embedding layer 14, 18 denotes a base electrode connected to the base layer 17, 19 denotes a high concentration n-type emitter layer selectively formed on the base layer 17, and 20 denotes an emitter electrode formed on the emitter layer 19.

21 denotes a first insulation film formed on the n-type epitaxial layer 6, 22 denotes a second insulation film formed on the first insulation film 21, and 23 denotes a light receiving surface created in such a way that the second insulation film 22 of the photo diode 2 is selectively removed in order for the first insulation film 21 to be exposed. A thickness and a refractive index of the first insulation film 21 are optimized, so that a reflection preventing film for reducing the reflection of an incident light in the interface is provided.

An operation of the OEIC thus constituted is described below.

The light enters through the light receiving surface 23 and is absorbed by the cathode layer 8 and the p-type epitaxial layer 5 which is an anode. As a result, electron-hole pairs are generated. When a reverse bias is applied to the photo diode 2 at the time, a depletion layer extends on the side of the p-type epitaxial layer 5 of which the dopant concentration is low. Of the electron-hole pairs generated in the vicinity of the depletion layer, the electrons and the holes are diffused and drifted and thereby separated from each other, and arrive at the cathode contact layer 9 and the anode embedding layer 11, respectively. Then, carriers are retrieved as optical current from the cathode electrode 10 and the anode electrode 13. The optical current is amplified and signal-processed by an electronic circuit comprising the NPN transistor 3 and the resistance element and capacitance element provided on the silicon substrate 1, and then outputted as recording and reproduction signals for the optical disc.

In the structure according to the conventional technology, however, the optical current in the photodiode 2 is roughly divided into diffusion current components and drift current components. The diffusion current is dominated by the diffusion of minority carriers up to the end of the depletion layer. Therefore, a response speed of the diffusion current component is lower than that of the drift current component resulting from an electrical field in the depletion layer. Further, there are some carriers which are recombined before reaching the depletion layer. Thus, the diffusion current may cause the deterioration of a frequency characteristic and light receiving sensitivity of the photodiode 2. The percentage of the carriers absorbed in a surface vicinity is increased as the optical wavelength is shorter. In the case of silicon, for example, the depth of approximately 11 μm is necessary in order to obtain the carrier absorption ratio of 95% in the red light having the wavelength of 650 nm which is used as the light source for DVD, while the absorption ratio at the same level can be obtained in the depth of approximately 0.8 μm in the case of the blue light having the wavelength of 405 nm. Thus, a light having a short wavelength is seriously affected in the vicinity of the silicon surface.

Below is described another optical semiconductor device proposed in order to solve the problem. FIG. 12 is a schematic sectional view of the OEIC thus proposed.

In FIG. 12, 24 denotes a low concentration first p-type epitaxial layer formed on the high concentration p-type embedding layer 4, 25 denotes a low concentration second p-type epitaxial layer formed on the first p-type epitaxial layer 24. This constitution is different to that of FIG. 11 in that the reference numerals 24 and 25 both denote the p-type epitaxial layers. The rest of the constitution is the same as that of the conventional example illustrated in FIG. 11.

In this constitution, a cathode made of the cathode contact layer 9 and an anode made of the first p-type epitaxial layer 24 and the second p-type epitaxial layer 25 constitute the light receiving element. In comparison to the constitution illustrated in FIG. 11, the cathode layer is very thin.

When the light enters through the light receiving surface 23, it is absorbed by the cathode contact layer 9, first p-type epitaxial layer 24 and second p-type epitaxial layer 25. As a result, electron-hole pairs are generated. The electrons and the holes are diffused and drifted and thereby separated from each other, and arrive at the cathode contact layer 9 and the anode embedding layer 11, respectively. As a result, optical current is generated. In the case where the depth of the cathode contact layer 9 is at most 0.3 μm, and the concentrations of the first p-type epitaxial layer 24 and the second p-type epitaxial layer 25 are approximately $1\times10^{14}$ cm$^{-3}$, for example, an anode depletion layer is extended by approximately 10 μm, and most of the incident light having a wavelength shorter than 650 nm which is particularly used for DVD is absorbed in the depletion layer. In other words, the diffusion current components are reduced and the drift current components are dominant in the optical current. Therefore, a high-speed response of the photodiode 2 can be realized.

PATENT DOCUMENT 1: 2005-183722 of the Japanese Patent Applications Laid-Open (Page 5-6, FIG. 1)

PATENT DOCUMENT 2: 2001-284629 of the Japanese Patent Applications Laid-Open (Pages 7-8, FIGS. 1-2)

DISCLOSURE OF THE INVENTION

Problems to be Solved by the Invention

In the anode in the constitution illustrated in FIG. 12, however, a low dopant concentration interface is present between the first p-type epitaxial layer 24 and the second p-type epitaxial layer 25. Therefore, during the growth of the second p-type epitaxial layer 25, auto doping from the anode embedding layer 11 and the collector embedding layer 14 in the periphery of the photodiode 2 may cause the dopant concentration in the interface to vary. As a result, the inversion to the n-type may occur in the worst case. If the inversion occurs, pn junction is generated in the anode, and the carriers generated by the absorption of light are recombined, thereby failing to contribute to the optical current. As a result, the frequency characteristic and light receiving sensitivity of the photodiode 2 may be deteriorated.

The present invention was made in order to solve the conventional problems, and a main object of the present invention is to provide an optical semiconductor device provided with a light receiving element characterized in its high speed and high light receiving sensitivity for blue light and a transistor characterized in its high speed on the same substrate.

Means for Solving the Problems

1) A first optical semiconductor device according to the present invention is an optical semiconductor device provided with a light receiving element and a transistor on the same substrate, comprising:

a second epitaxial layer of a second conductivity type having a low dopant concentration formed on a semiconductor substrate of first conductivity type;

a first diffusion layer of the first conductivity type having a low dopant concentration selectively formed on the second epitaxial layer; and a second diffusion layer of the second conductivity type having a high dopant concentration formed at an upper section of the first diffusion layer, wherein the first and second diffusion layers constitute the light receiving element, and the transistor is formed in the second epitaxial layer, and the first diffusion layer has its dopant concentration peak in the interface between the semiconductor substrate and the second epitaxial layer.

The "second" recited in the second epitaxial layer corresponds to a second epitaxial layer in the constitution 2) comprising a first epitaxial layer and a second epitaxial layer described later.

A method for manufacturing an optical semiconductor device according to the present invention corresponding to the first semiconductor device is a method for manufacturing an optical semiconductor device provided with a light receiving element and a transistor on the same substrate, comprising:

a) a step for forming a second epitaxial layer of a second conductivity type having a low dopant concentration on a semiconductor substrate of a first conductivity type;

b) a step for selectively forming a first diffusion layer of the first conductivity type having a low dopant concentration in the second epitaxial layer by means of ion implantation so that the first diffusion layer has its dopant concentration peak in the interface between the semiconductor substrate and the second epitaxial layer;

c) a step for forming a second diffusion layer of the second conductivity type having a high dopant concentration at an upper section of the first diffusion layer; and d) a step for selectively forming the transistor in the second epitaxial layer, wherein the first and second diffusion layers constitute the light receiving element.

The first conductivity type and the second conductivity type denote either the p type or the n type of a semiconductor. In the case where the first conductivity type is the p type, the second conductivity type is the n type. In the case where the first conductivity type is the n type, the second conductivity type is the p type (the same applying hereinafter).

According to the constitution, the combination of the first diffusion layer of first conductivity type having a low dopant concentration and the second diffusion layer of the second conductivity type having a high dopant concentration formed at the upper section of the first diffusion layer constitutes the diffusion layer in the light receiving element. Therefore, a substantially complete depletion of the light receiving element portion can be realized when the depth of the second diffusion layer is reduced, and the percentage of the recombination of the carriers is lessened because the optical current is dominated by the drift current. As a result, a high speed and a high light receiving sensitivity can be realized.

Further, the first diffusion layer has its dopant concentration peak in the vicinity of the interface between the semiconductor substrate and the second epitaxial layer, and the dopant concentration is set such that the depletion layer is adequately extended toward the first diffusion layer. Because the dopant concentration peak falls on the interface, the influence of the auto doping from the anode/collector embedding layers in the periphery of the light receiving element generated when the second epitaxial layer is grown can be reduced, and a desired concentration profile can be reliably realized.

A method for manufacturing another optical semiconductor device according to the present invention corresponding to the first semiconductor device is a method for manufacturing an optical semiconductor device provided with a light receiving element and a transistor on the same substrate, comprising:

a) a step for selectively forming a second embedding layer of a first conductivity type having a low dopant concentration and having its dopant concentration peak on a surface of a semiconductor substrate of the first conductivity type at an upper section of the semiconductor substrate;

b) a step for forming a second epitaxial layer of a second conductivity type having a low dopant concentration on the semiconductor substrate;

c) a step for forming a second diffusion layer of the second conductivity type having a high dopant concentration which is bonded to the second embedding layer at an upper section of the second epitaxial layer; and d) a step for selectively forming the transistor in the second epitaxial layer, wherein the second embedding layer and the second diffusion layer constitute the light receiving element.

2) A second optical semiconductor device according to the present invention is an optical semiconductor device provided with a light receiving element and a transistor on the same substrate, comprising:

an embedding layer of a first conductivity type having a high dopant concentration formed at an upper section of a semiconductor substrate of the first conductivity type;

a first epitaxial layer of the first conductivity type having a low dopant concentration formed on the embedding layer;

a second epitaxial layer of a second conductivity type having a low dopant concentration formed on the first epitaxial layer;

a first diffusion layer of the first conductivity type having a low dopant concentration selectively formed on the second epitaxial layer; and a second diffusion layer of the second conductivity type having a high dopant concentration formed at an upper section of the first diffusion layer, wherein the first and second diffusion layers constitute the light receiving element, and the transistor is formed in the second epitaxial layer, and the first diffusion layer has its dopant concentration peak in the interface between the first and second epitaxial layers.

According to the constitution, a potential barrier is formed between the semiconductor substrate and the embedding layer of the first conductivity type having a high dopant concentration. The light absorbed in the semiconductor substrate fails to pass the potential barrier, and the carriers are thereby recombined, which reduces the diffusion current components. When a low concentration and an appropriate film thickness are selected for the first epitaxial layer of the first conductivity type having a low dopant concentration and the first diffusion layer of the first conductivity type having a low dopant concentration, a complete depletion can be realized, and a higher speed can be achieved. Further, because the embedding layer of the first conductivity type having a high dopant concentration is provided, a series resistance created in the case where the carriers move toward the anode is reduced, which further improves the speed.

3) In the constitutions in 1) and 2), preferably, a well layer of the second conductivity type selectively formed in the second epitaxial layer is further provided, and the transistor is formed in the well layer. In the case where the concentration of the well layer of the second conductivity type is set to be higher than that of the second epitaxial layer of the second conductivity type having a low dopant concentration in the foregoing constitution, a collector resistance of the transistor is reduced. As a result, the speed can be further improved.

4) Further, preferably, a well layer of the first conductivity type selectively formed in the second epitaxial layer is further provided, and the transistor is formed in the well layer. This constitution is effective for a vertical transistor. In the case where the well layer of the first conductivity type is thus formed apart from the first diffusion layer of the first conductivity type having a low dopant concentration, the concentration of the well layer of the first conductivity type can be increased. As a result, the collector resistance can be reduced, and a higher speed can be realized in the vertical transistor.

5) Further, a third diffusion layer of the first conductivity type having its dopant concentration peak on a surface of the second epitaxial layer is preferably further provided at an upper section of the first diffusion layer. Thus constituted, the auto doping generated when the second epitaxial layer is grown can be reduced. In addition, a concentration gradient is formed in an anode effective concentration profile, and a potential slope is formed, and the speed at which the carriers move in the direction of the epitaxial layer is increased. As a result, the light receiving element can achieve a higher speed.

EFFECT OF THE INVENTION

According to the optical semiconductor device and the method of manufacturing the optical semiconductor device provided by the present invention, when the depth of the second diffusion layer of the second conductivity type is reduced, a substantially complete depletion of the photodiode portion can be realised. Further, the percentage of the carriers which are recombined decreases since the optical current is dominated by the drift current. As a result, a higher speed and a higher light receiving sensitivity can be realized.

Further, the dopant concentration peak of the first diffusion layer is provided in the interface between the semiconductor substrate and the epitaxial layer of the first conductivity type. Accordingly, any influence of the auto doping generated from peripheral embedding layers can be controlled, and the interfacial concentration can be stabilized. As a result, the depletion layer can be reliably formed in the anode, and the photodiode can achieve a higher speed and a good reproducibility.

BRIEF DESCRIPTION OF THE DRAWINGS

FIG. 8B is a process sectional view illustrating the method of manufacturing the optical semiconductor device according to the preferred embodiment 2.

DESCRIPTION OF REFERENCE SYMBOLS

Figure 1:
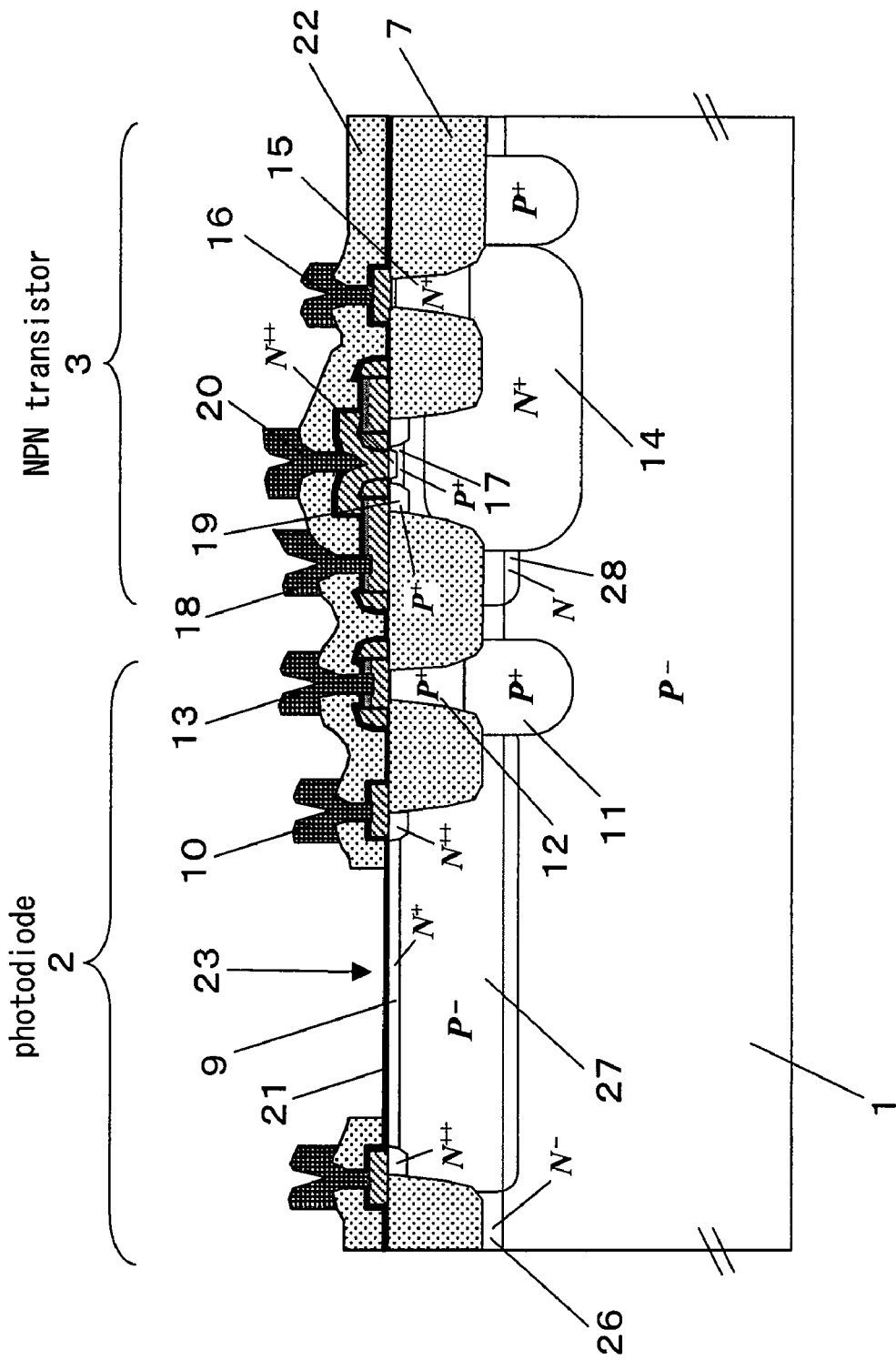
FIG. 1 is a sectional view illustrating a constitution of an optical semiconductor device according to a preferred embodiment 1 of the present invention.

1 silicon substrate
2 photodiode
3 NPN transistor
4 p-type embedding layer
5 p-type epitaxial layer (first epitaxial layer)
6 n-type epitaxial layer
7 LOCOS isolation layer
8 cathode layer
9 cathode contact layer (second diffusion layer)
10 cathode electrode
11 anode embedding layer
12 anode contact layer
13 anode electrode
14 collector embedding layer
15 collector contact layer
16 collector electrode
17 base layer
18 base electrode
19 emitter layer
20 emitter electrode
21 first insulation film
22 second insulation film
23 light receiving surface
24 first p-type epitaxial layer
25 second p-type epitaxial layer
26 n-type epitaxial layer (second epitaxial layer)
27 anode layer (first diffusion layer)
28 n-type well layer
29 anode layer (first diffusion layer)
30 low concentration anode embedding layer
31 low concentration anode diffusion layer (third diffusion layer)
32 anode effective concentration profile
40 photodiode
41 NPN transistor
42 silicon substrate
43 p-type embedding layer
44 n-type embedding layer
45 n-type epitaxial layer (second epitaxial layer)
46 anode diffusion layer (first diffusion layer)
47 n-type well layer
48 LOCOS isolation layer
49 cathode layer (second diffusion layer)
50 anode embedding layer (second embedding layer)
51 anode diffusion layer (third diffusion layer)
52 p-type embedding layer (first embedding layer)
53 p-type epitaxial layer (first epitaxial layer)

PREFERRED EMBODIMENTS OF THE PRESENT INVENTION

Preferred Embodiment 1 of Optical Semiconductor Device

A preferred embodiment 1 of an optical semiconductor device according to the present invention is described referring to the drawings.

FIG. 1 is a sectional view illustrating a constitution of an optical semiconductor device according to the preferred embodiment 1. In FIG. 1, 1 denotes a low concentration p-type silicon substrate, 2 denotes a photodiode, 3 denotes an NPN transistor, 7 denotes a LOCOS isolation layer, 9 denotes a cathode contact layer (second diffusion layer), 10 denotes a cathode electrode, 11 denotes an anode embedding layer, 12 denotes an anode contact layer, 13 denotes an anode electrode, 14 denotes a high concentration n-type collector embedding layer, 15 denotes a collector contact layer, 16 denotes a collector electrode, 17 denotes abase layer, 18 denotes a base electrode, 19 denotes an emitter layer, 20 denotes an emitter electrode, 21 denotes a first insulation film, 22 denotes a second insulation film, and 23 denotes a light receiving surface. These components are the same as those provided in the conventional structure.

Further, 26 denotes a low concentration n-type epitaxial layer (second epitaxial layer) formed on the silicon substrate 1, 27 denotes a low concentration p-type anode layer (first diffusion layer) formed by means of diffusion in the region of the photodiode 2 in the n-type epitaxial layer 26, and 28 denotes an n-type well layer formed by means of diffusion in the region of the NPN transistor 3 in the n-type epitaxial layer 26 and having a concentration higher than that of the n-type epitaxial layer 26.

An operation of the optical semiconductor device according to the present preferred embodiment thus constituted is described below.

Figure 11:
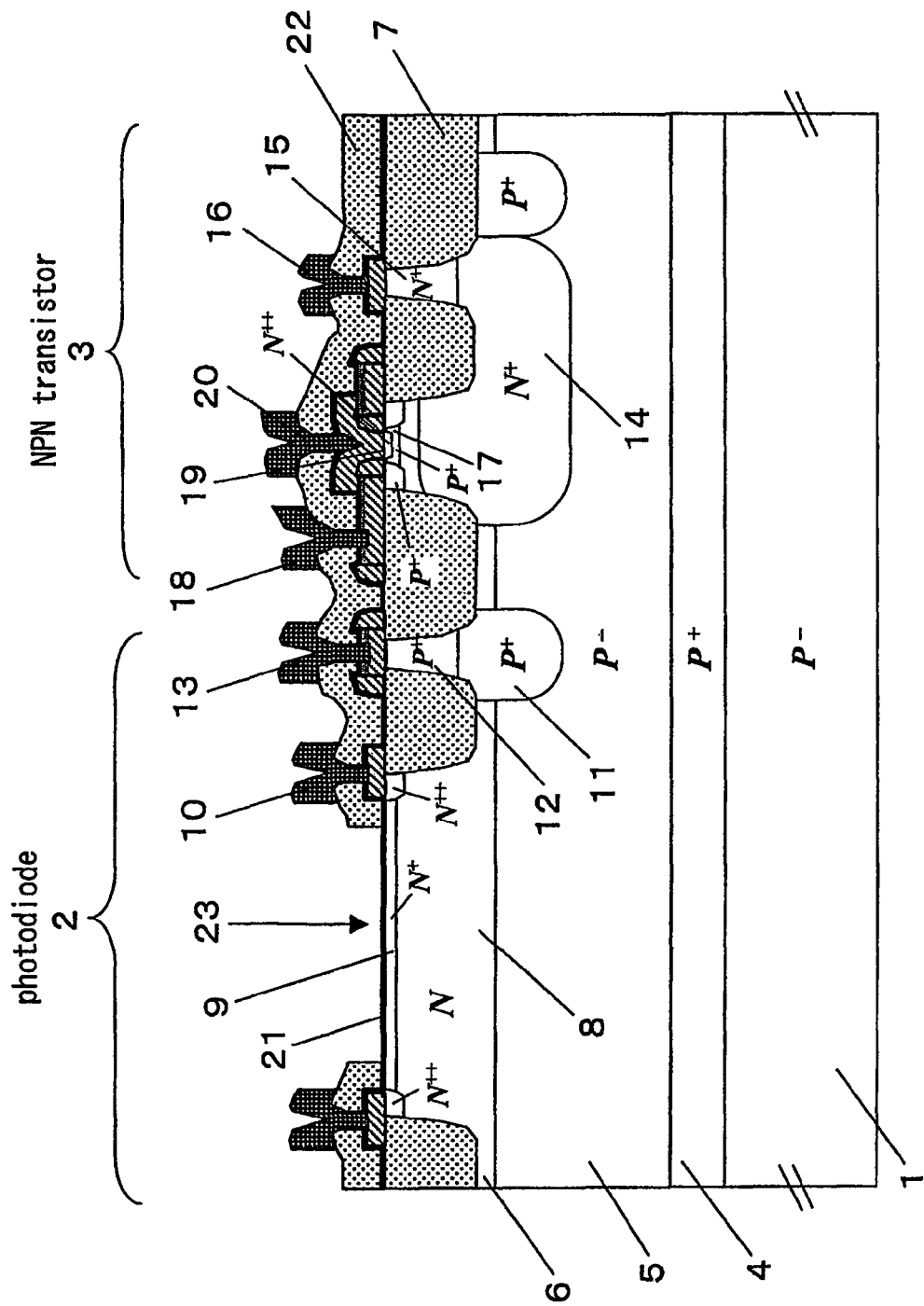
FIG. 11 is a sectional view illustrating a constitution of a conventional optical semiconductor device.
Figure 12:
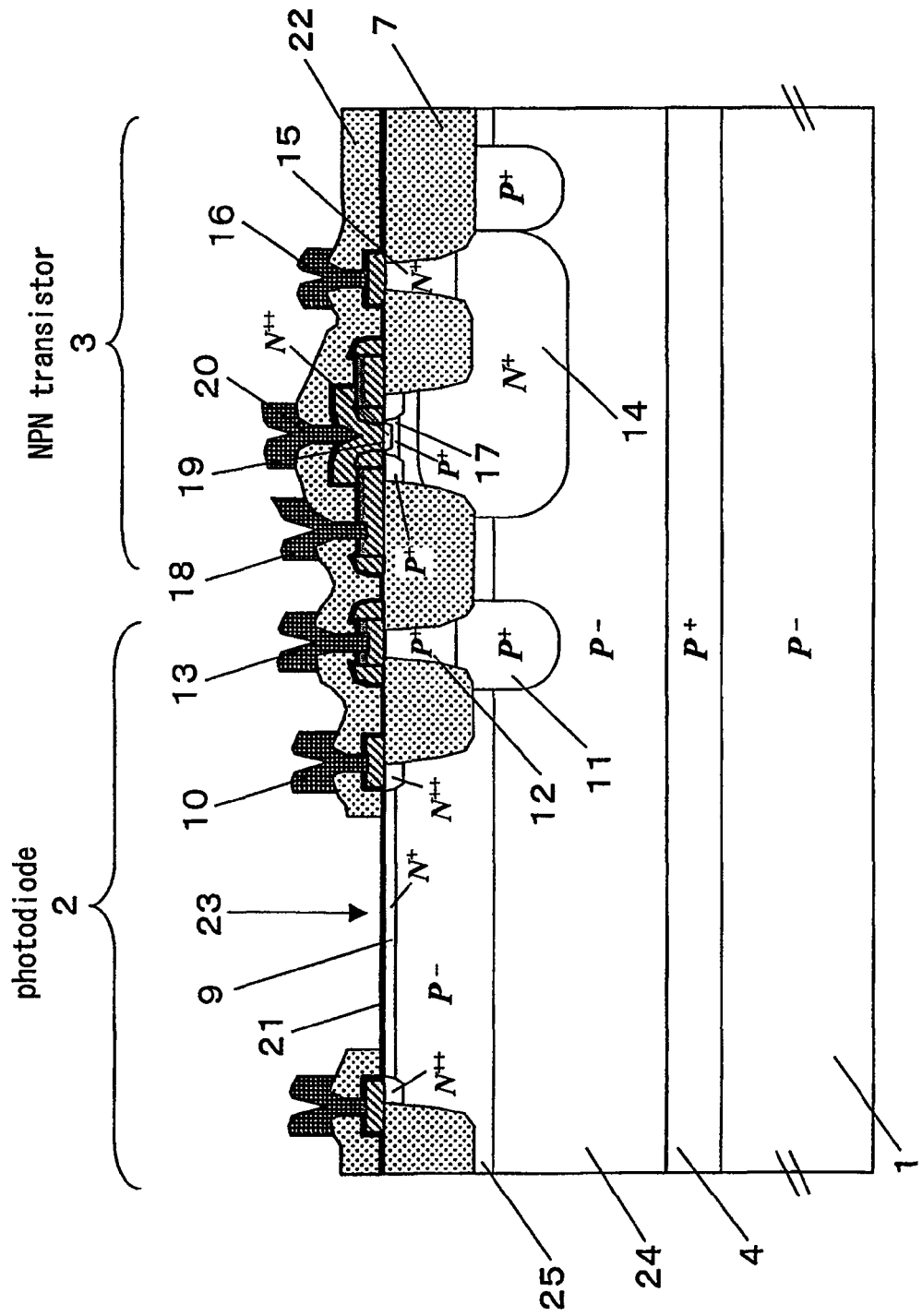
FIG. 12 is a sectional view illustrating a constitution of another conventional optical semiconductor device.

A basic operation is the same as described referring to FIGS. 11 and 12. An incident light entering through the light receiving surface 23 is absorbed by the cathode contact layer 9, anode layer 27 and silicon substrate 1, and electron-hole pairs are thereby generated. The electrons and the holes are diffused and drifted and thereby separated from each other, and respectively arrive at the cathode contact layer 9 and the anode embedding layer 11. Accordingly, optical current is generated. In the case where the depth of the cathode contact layer 9 is at most 0.3 µm, and the concentrations of the p-type silicon substrate 1 and the anode layer 27 are approximately $1 \times 10^{14}$ cm$^{-3}$, for example, an anode depletion layer is extended by approximately 10 µm, and most of the incident light having a wavelength shorter than 650 nm which is particularly used for DVD is absorbed in the depletion layer. In other words, diffusion current components are reduced and drift current components are dominant in the optical current. Therefore, a high-speed response of the photodiode 2 can be realized. Further, the percentage of carriers which are recombined is reduced, which improves a light receiving sensitivity.

Figure 2:
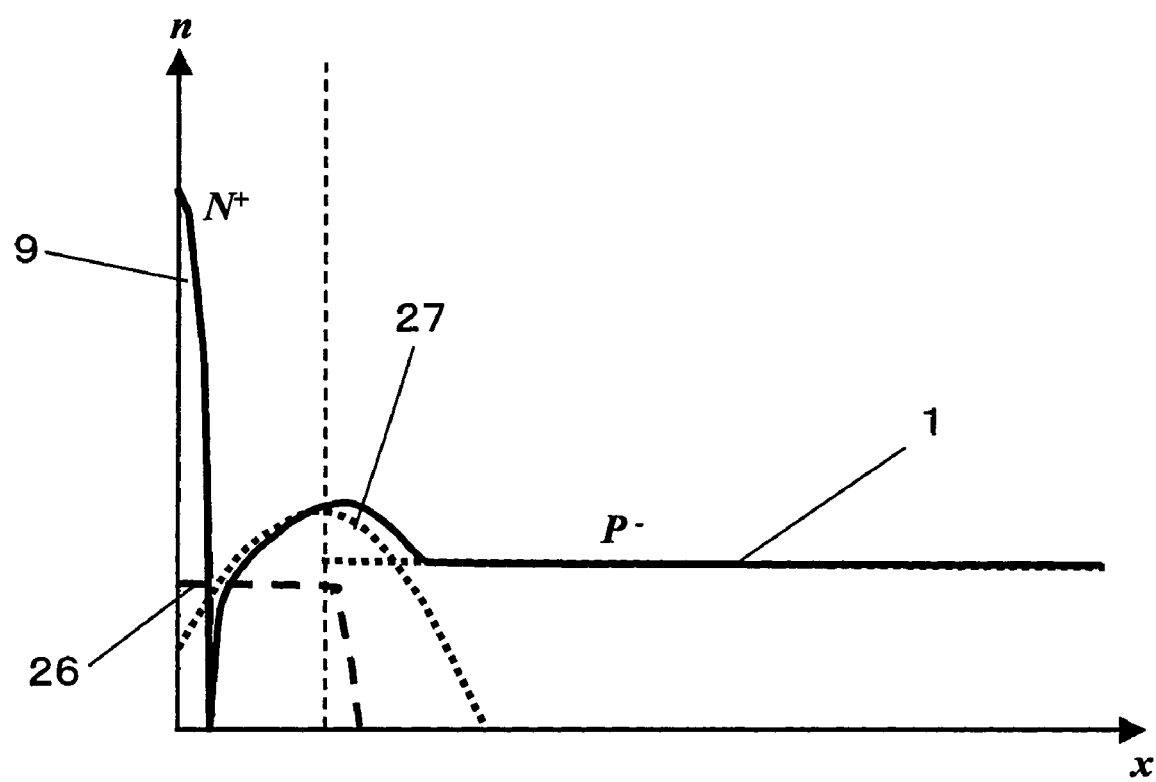
FIG. 2 is an illustration of a photodiode concentration profile in the optical semiconductor device according to the preferred embodiment 1.

FIG. 2 illustrates a concentration profile in the depth direction of the photodiode 2. Reference numerals shown in the drawings are the same as those shown in FIG. 1. The anode layer (first diffusion layer) 27 has a dopant concentration peak in the vicinity of the interface between the silicon substrate 1 and the n-type epitaxial layer (second epitaxial layer) 26. A dotted line in the vertical direction denotes the interface. The dopant concentration is set so that the depletion layer adequately extends toward the anode layer 27. In this constitution wherein the dopant concentration peak falls on the interface, any influence of the auto doping from the anode embedding layer 11 and the collector embedding layer 14 in the periphery of the photodiode 2 generated when the n-type epitaxial layer 26 is grown can be reduced, and a desired concentration profile can be reliably realized.

In the present preferred embodiment, the collector embedding layer 14 and the n-type well layer 28 constitute a collector of the NPN transistor 3. When the concentration of the n-type well layer 28 is set to be higher than that of the n-type epitaxial layer 26, a collector resistance is lessened, and a high-speed characteristic can be realized.

More specifically, the photodiode 2 characterized in its high speed and high sensitivity and the high-speed transistor 3 can be formed on the same substrate in a stable manner, which realizes such a structure that can maximize the characteristic improvement of the respective elements. As a result, characteristics of the OEIC can be improved.

The present preferred embodiment is particularly effective for a light having a short wavelength of which an absorption coefficient is large. 95% of the carriers are absorbed in the depth of 0.8 µm in the blue light for BD (wavelength of 405 nm). Therefore, almost 100% of the carriers are absorbed provided that the thickness of the n-type epitaxial layer 26 is 1 µm. Further, in the NPN transistor 3, it is better for the n-type epitaxial layer 26 to be thinner in order to improve the speed by reducing a parasitic capacitance and a parasitic resistance. For example, the speed can be improved in the NPN transistor 3 in the case where the thickness of n-type epitaxial layer 26 is 1 µm.

Preferred Embodiment 2 of Optical Semiconductor Device

A preferred embodiment 2 of the optical semiconductor device according to the present invention is described referring to the drawings.

Figure 3:
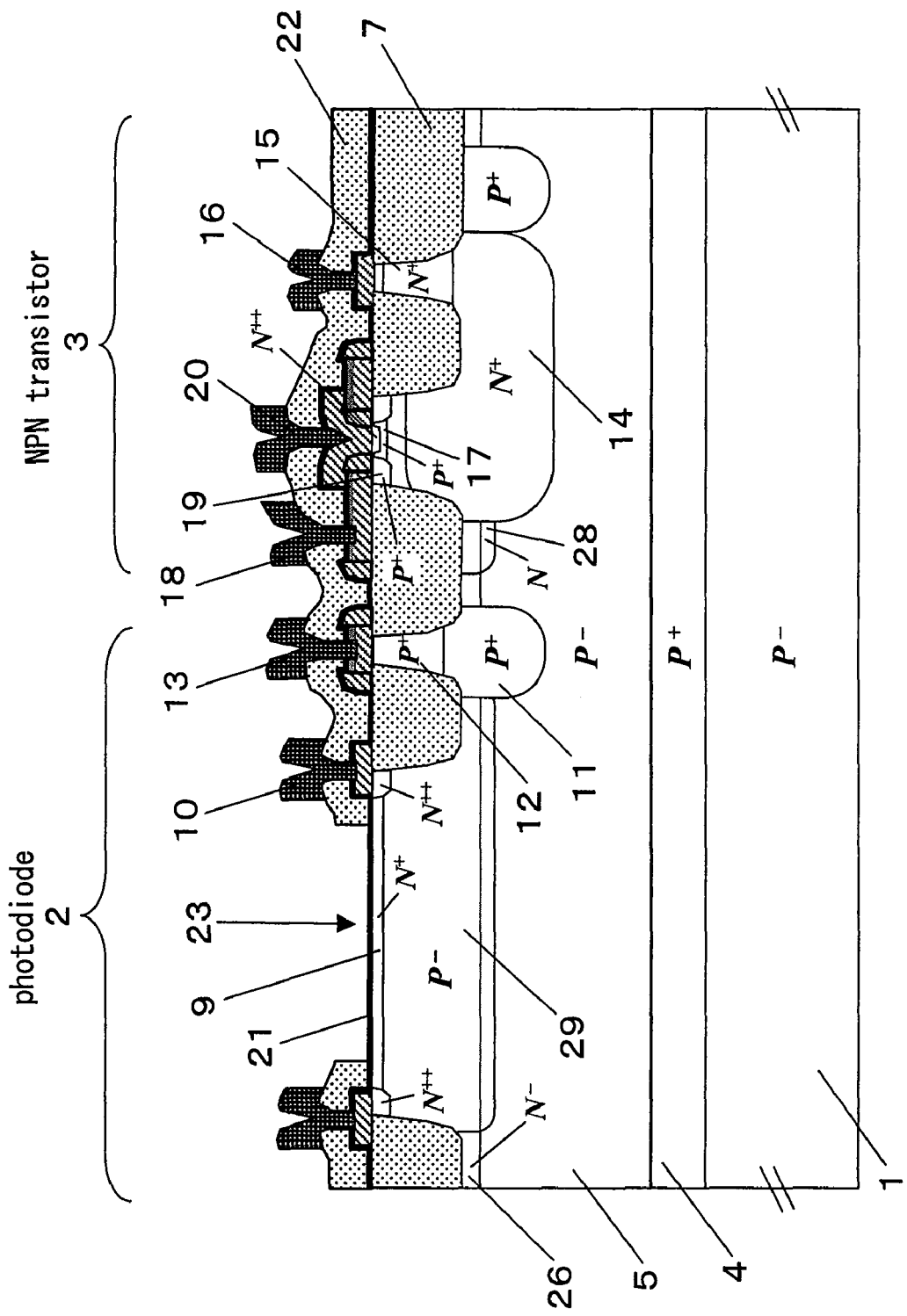
FIG. 3 is a sectional view illustrating a constitution of an optical semiconductor device according to a preferred embodiment 2 of the present invention.

FIG. 3 is a sectional view illustrating a constitution of an optical semiconductor device according to the preferred embodiment 2. In FIG. 3, 4 denotes a high concentration p-type embedding layer formed on a silicon substrate 1, 5 denotes a low concentration p-type epitaxial layer (first epitaxial layer) formed on the p-type embedding layer 4, and 29 denotes a low concentration p-type anode layer (first diffusion layer). The rest of the constitution is the same as that of the preferred embodiment 1.

The optical semiconductor device according to the present preferred embodiment is characterized in that a silicon substrate 1, a p-type embedding layer 4 and a p-type epitaxial layer (first epitaxial layer) 5 are used in place of the silicon substrate 1 according to the preferred embodiment 1.

Figure 4:
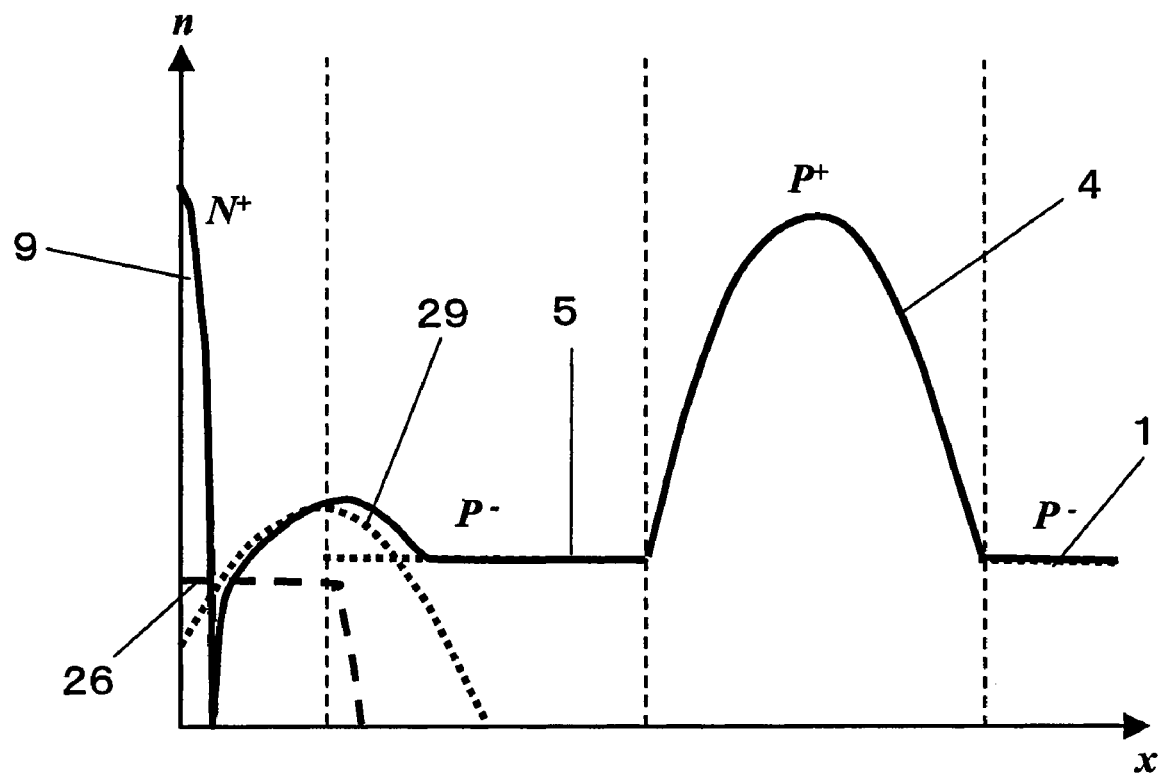
FIG. 4 is an illustration of a photodiode concentration profile in the optical semiconductor device according to the preferred embodiment 2.

FIG. 4 shows a concentration profile in the depth direction of the photodiode 2. Numerals shown in the drawing are the same as those shown in FIG. 3. The anode layer (first diffusion layer) 29 has a dopant concentration peak in the vicinity of the interface between the p-type epitaxial layer (first epitaxialy layer) 5 and the n-type epitaxial layer (second epitaxial layer) 26. Therefore, the influence of the auto doping generated when the n-type epitaxial layer 26 is grown can be reduced, and a desired concentration profile can be reliably realized.

The constitution according to the present preferred embodiment is advantageous in that, in addition to the effect according to the preferred embodiment 1, potential barrier is formed between the silicon substrate 1 and the p-type embedding layer 4, and the light absorbed in the silicon substrate 1 fails to pass the potential barrier and the carriers are thereby recombined, which results in the reduction of the diffusion current components. A complete depletion can be realized when a low concentration and an appropriate film thickness are selected for the p-type epitaxial layer 5 and the anode 29, and a higher speed can be thereby realized. Further, a series resistance in the case where the carriers move toward the anode embedding layer 11 is lessened due to the presence of the p-type embedding layer 4, which leads to the realization of a higher speed.

Preferred Embodiment 3 of Optical Semiconductor Device

A preferred embodiment 3 of an optical semiconductor device according to the present invention is described referring to the drawings.

Figure 5:
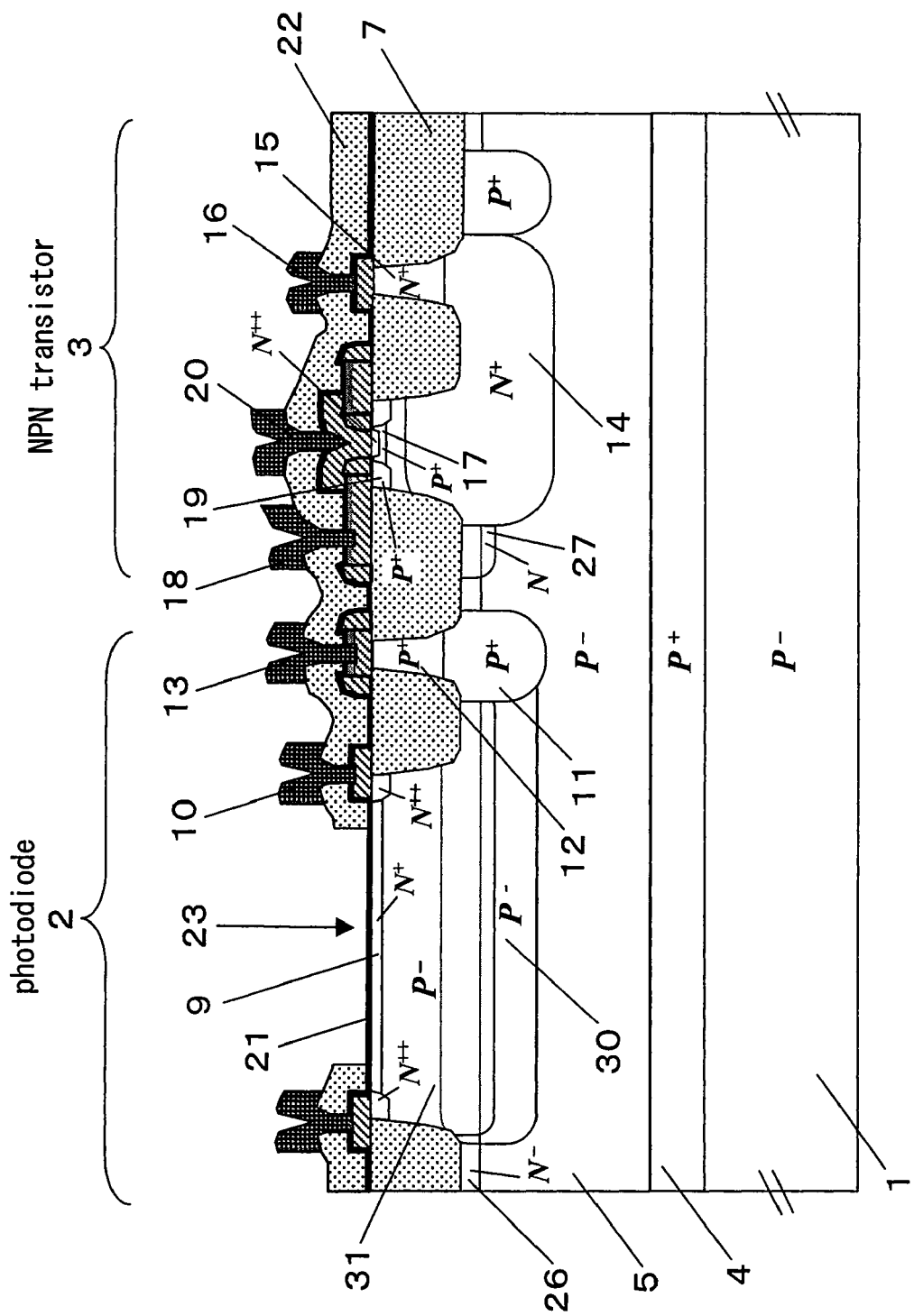
FIG. 5 is a sectional view illustrating a constitution of an optical semiconductor device according to a preferred embodiment 3 of the present invention.

FIG. 5 is a sectional view illustrating a constitution of an optical semiconductor device according to the preferred embodiment 3. In FIG. 5, 30 denotes a low concentration p-type anode embedding layer, and 31 denotes a low concentration p-type anode diffusion layer (third diffusion layer). The rest of the constitution is the same as that of the preferred embodiment 1.

Figure 6:
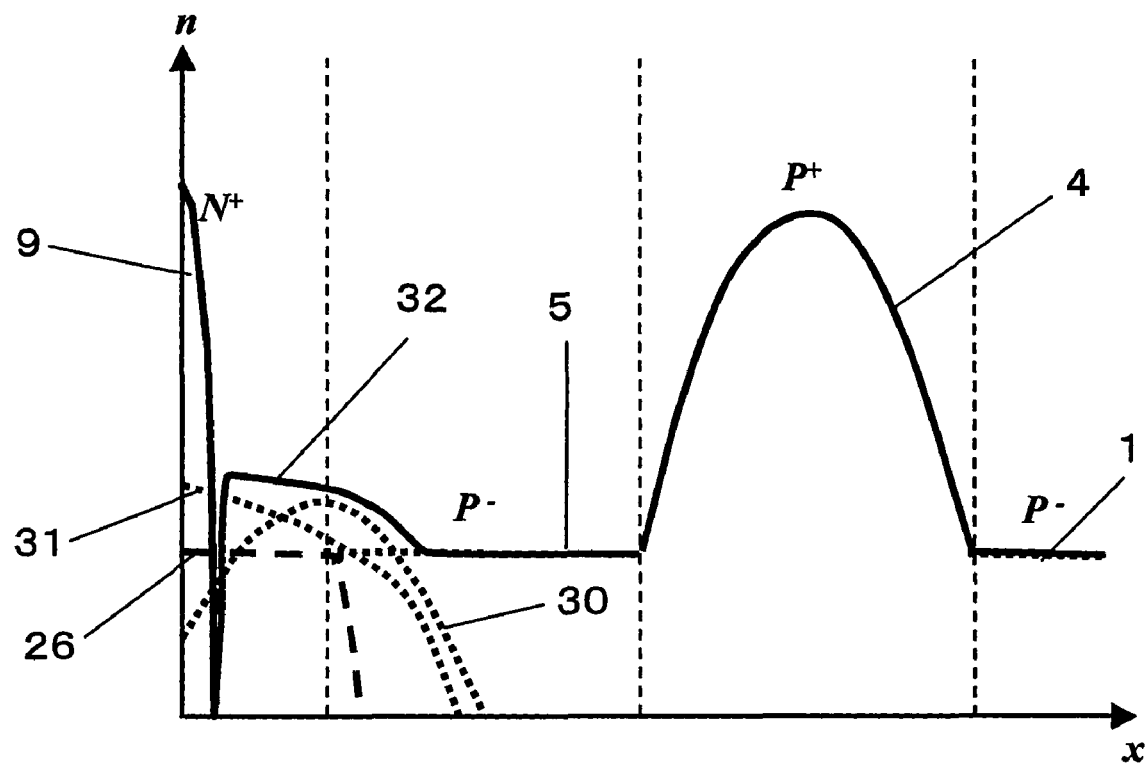
FIG. 6 is an illustration of a photodiode concentration profile in the optical semiconductor device according to the preferred embodiment 3.

FIG. 6 illustrates a concentration profile in the depth direction of the photodiode 2, wherein 32 denotes an anode effective concentration profile. The rest of the reference numerals shown therein are the same as those shown in FIG. 5.

The low concentration anode embedding layer 30 has a dopant concentration peak in the vicinity of the interface between the p-type epitaxial layer (first epitaxial layer) 5 and the n-type epitaxial layer (second epitaxial layer) 26.

Further, the low concentration anode diffusion layer (third diffusion layer) 31 has a dopant concentration peak in the vicinity of the surface of the n-type epitaxial layer (second epitaxial layer) 26.

Thus constituted, a concentration gradient is formed in the anode effective concentration profile 32 in addition to the reduction of the auto doping during the growth of the n-type epitaxial layer 26. Accordingly, a potential slope is formed, and the speed at which the carriers move in the depth direction of the p-type epitaxial layer 5 is increased. As a result, the photodiode 2 can achieve a higher speed.

Preferred Embodiment 1 of Method for Manufacturing Optical Semiconductor Device FIGS. 7A-7E are sectional views illustrating processing steps of a preferred embodiment 1 of a method for manufacturing the optical semiconductor device according to the present invention. 40 denotes a photodiode, 41 denotes an NPN transistor, 42 denotes a low concentration p-type silicon substrate, 43 denotes a p-type embedding layer, 44 denotes an n-type embedding layer of a collector of the NPN transistor 41, 45 denotes a low concentration n-type epitaxial layer (second epitaxial layer), 46 denotes a low concentration p-type anode diffusion layer (first diffusion layer), 47 denotes an n-type well layer having a concentration higher than that of the n-type epitaxial layer 45, 48 denotes a LOCOS isolation layer, and 49 denotes a high concentration n-type cathode layer (second diffusion layer).

Figure 7A:
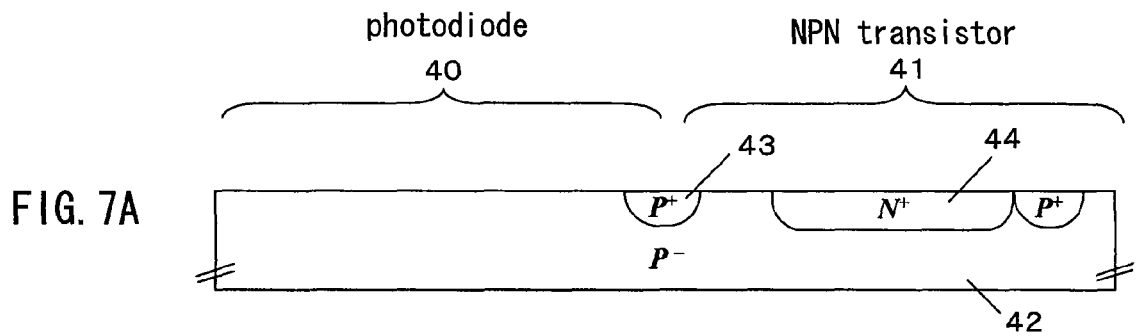
FIG. 7A is a process sectional view illustrating a method of manufacturing the optical semiconductor device according to the preferred embodiment 1.

First, the p-type embedding layer 43 and the n-type embedding layer 44 are selectively formed in the silicon substrate 42 by means of the ion implantation or the like (see FIG. 7A).

Figure 7B:
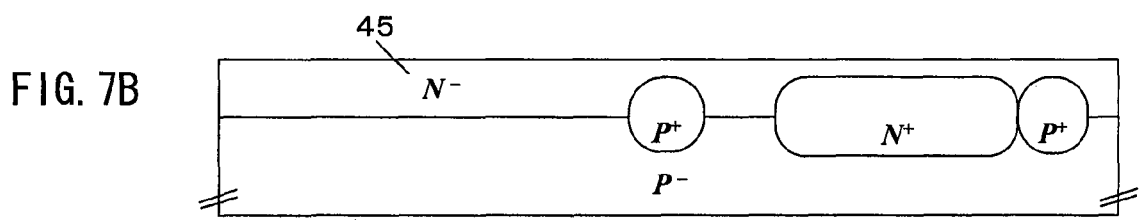
FIG. 7B is a process sectional view illustrating the method of manufacturing the optical semiconductor device according to the preferred embodiment 1.
Figure 7C:
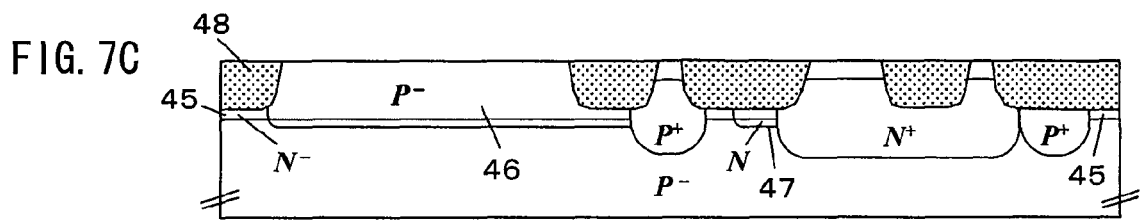
FIG. 7C is a process sectional view illustrating the method of manufacturing the optical semiconductor device according to the preferred embodiment 1.

Next, the n-type epitaxial layer (second epitaxial layer) 45 (for example, film thickness: approximately 1 μm, concentration: approximately $5 \times 10^{14}$ cm$^{-3}$) is grown on the silicon substrate 42 (see FIG. 7B).

Next, the p-type anode diffusion layer (first diffusion layer) 46 is selectively formed in the region of the photodiode 40 in the n-type epitaxial layer (second epitaxial layer) 45 by means of the ion implantation under high-energy conditions (for example, acceleration energy: 200 keV, dosing amount: $1 \times 10^{11}$ cm$^{-2}$) so that the dopant concentration peak is in the vicinity of the interface between the silicon substrate 42 and the n-type epitaxial layer (second epitaxial layer) 45. After that, the n-type well layer 47 is selectively formed in the region of the NPN transistor 41 by means of the ion implantation or the like, and then, the LOCOS isolation layer 48 is formed (see FIG. 7C).

Figure 7D:
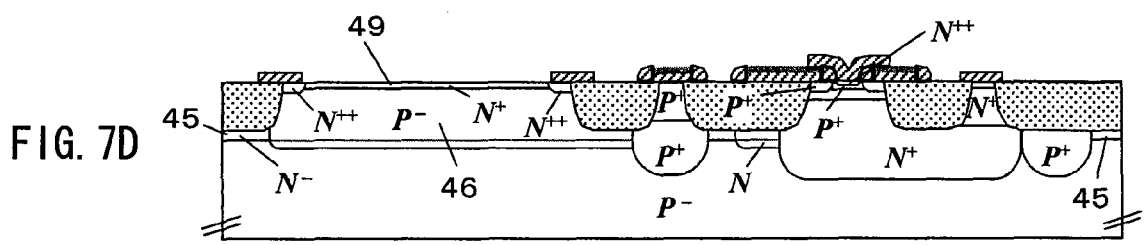
FIG. 7D is a process sectional view illustrating the method of manufacturing the optical semiconductor device according to the preferred embodiment 1.
Figure 7E:
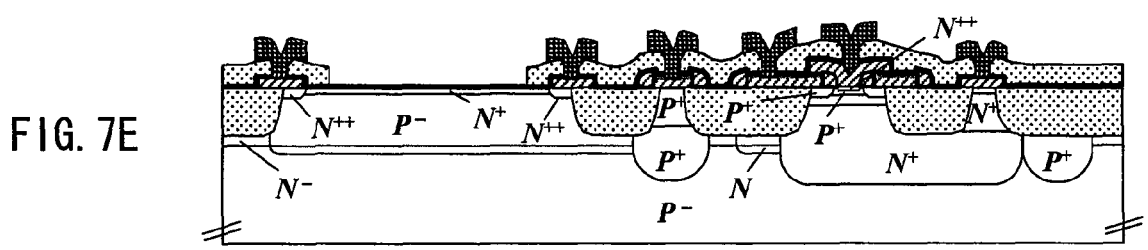
FIG. 7E is a process sectional view illustrating the method of manufacturing the optical semiconductor device according to the preferred embodiment 1.

Further, the cathode layer (second diffusion layer) 49 and a base/emitter diffusion layer of the NPN transistor 41 are formed on the anode diffusion layer (first diffusion layer) 46, and on the n-type layer 47, respectively (see FIG. 7D). Finally, field films and electrodes are formed so that the photodiode 40 and the NPN transistor 41 are formed (see FIG. 7E).

Below is given the summary of the processing steps described so far.

A method for manufacturing an optical semiconductor device provided with the light receiving element 40 and the transistor 41 on the same substrate 42, comprising:

a) a step for forming the second epitaxial layer 45 of a second conductivity type (n-type) having a low dopant concentration on the semiconductor substrate 42 of a first conductivity type (p-type);

b) a step for selectively forming the first diffusion layer 46 of the first conductivity type (p-type) having a low dopant concentration in the second epitaxial layer 45 by means of the ion implantation so that the first diffusion layer has its dopant concentration peak in the interface between the semiconductor substrate 42 and the second epitaxial layer 45;

c) a step for forming the second diffusion layer 49 of the second conductivity type (n-type) having a high dopant concentration at an upper section of the first diffusion layer 46; and d) a step for selectively forming the transistor 41 in the second epitaxial layer 45, wherein the first diffusion layer 46 and the second diffusion layer 49 constitute the light receiving element 40.

Preferred Embodiment 2 of Method for Manufacturing Optical Semiconductor Device FIGS. 8A-8E are sectional views illustrating processing steps of a preferred embodiment 2 of the method for manufacturing the optical semiconductor device according to the present invention. In the drawings, 50 denotes a low concentration p-type anode embedding layer (second embedding layer). The rest of the constitution is the same as illustrated in FIGS. 7.

Figure 8A:
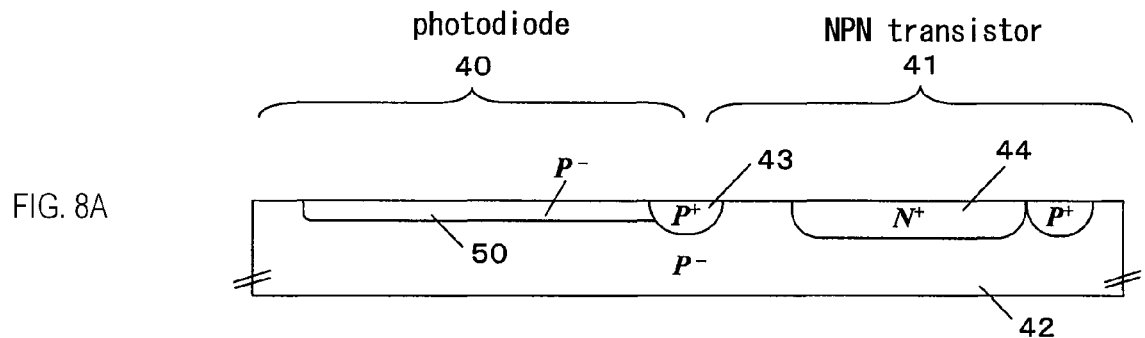
FIG. 8A is a process sectional view illustrating a method of manufacturing the optical semiconductor device according to the preferred embodiment 2.

First, the p-type embedding layer 43, n-type embedding layer 44 and anode embedding layer (second embedding layer) 50 are selectively formed in the silicon substrate 42 by means of the ion implantation or the like (see FIG. 8A). In the formation, conditions are set so that the anode embedding layer (second embedding layer) 50 has its dopant concentration peak in the vicinity of the surface of the silicon substrate 42 (for example, acceleration energy: 30 keV, dosing amount: $1 \times 10^{11}$ cm$^{-2}$).

Next, the n-type epitaxial layer (second epitaxial layer) 45 (for example, film thickness: 1 μm, concentration: $5 \times 10^{14}$ cm$^{-3}$) is grown on the silicon substrate 42 (see FIG. 8B).

Figure 8C:
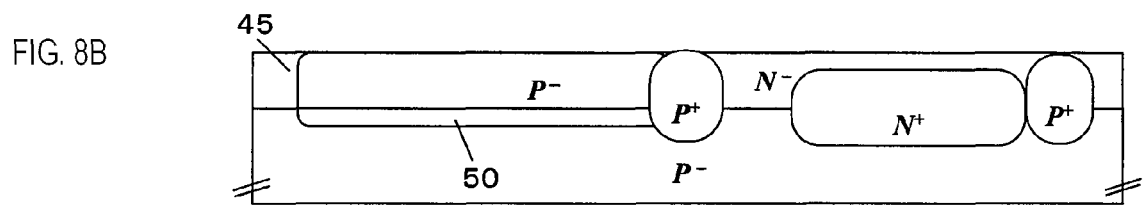
FIG. 8C is a process sectional view illustrating the method of manufacturing the optical semiconductor device according to the preferred embodiment 2.

Then, in the n-type epitaxial layer 45, the n-type well layer 47 is selectively formed in the region of the NPN transistor 41 by means of the ion implantation or the like, and, the LOCOS isolation layer 48 is thereafter formed (see FIG. 8C). At the time, a heat treatment is provided so that the anode embedding layer (second embedding layer) 50 diffuses onto the surface of the n-type epitaxial layer (second epitaxial layer) 45.

Figure 8D:
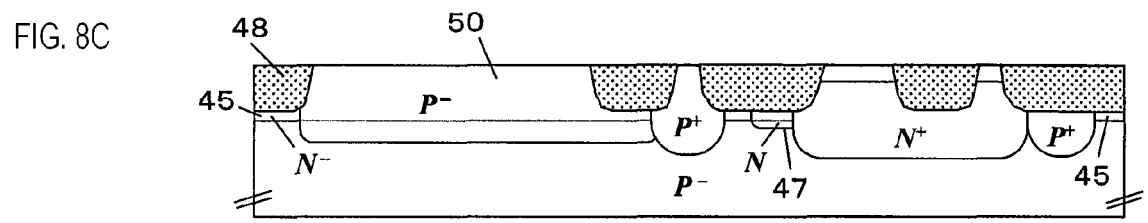
FIG. 8D is a process sectional view illustrating the method of manufacturing the optical semiconductor device according to the preferred embodiment 2.
Figure 8E:
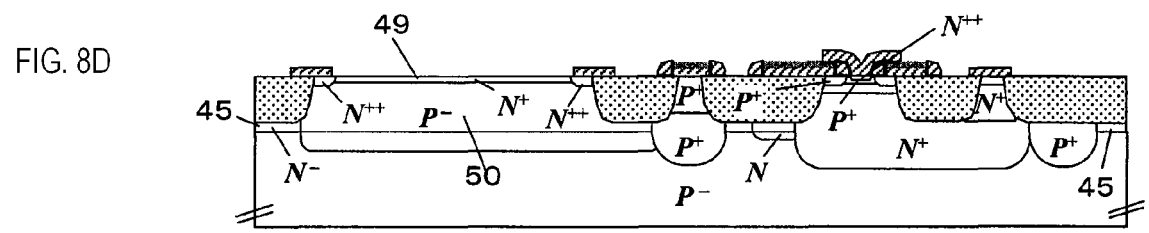
FIG. 8E is a process sectional view illustrating the method of manufacturing the optical semiconductor device according to the preferred embodiment 2.

Further, the cathode layer (second diffusion layer) 49 and the base/emitter diffusion layer of the NPN transistor 41 are formed on the anode embedding layer (second embedding layer) 50, and on the n-type layer 47, respectively (see FIG. 8D). Finally, filed films and electrodes are formed so that the photodiode 40 and the NPN transistor 41 are formed (see FIG. 8E).

The processing steps described so far can be summarized as below.

A method for manufacturing an optical semiconductor device provided with the light receiving element 40 and the transistor 41 on the same substrate 42, comprising:

a) a step for selectively forming the second embedding layer 50 of a first conductivity type (p-type) having a low dopant concentration and having its dopant concentration peak on the surface of the semiconductor substrate 42 at an upper section of the semiconductor substrate 42 of the first conductivity type (p-type);

b) a step for forming the second epitaxial layer 45 of a second conductivity type (n-type) having a low dopant concentration on the semiconductor substrate 42;

c) a step for forming the second diffusion layer 49 of the second conductivity type (n-type) having a high dopant concentration bonded to the second embedding layer 50 at an upper section of the second epitaxial layer 45; and d) a step for selectively forming the transistor 41 in the second epitaxial layer 45, wherein the second embedding layer 50 and the second diffusion layer 49 constitute the light receiving element 40.

Preferred Embodiment 3 of Method for
Manufacturing Optical Semiconductor Device

FIGS. 9A-9E are sectional views illustrating processing steps of a preferred embodiment 3 of the method for manufacturing the optical semiconductor device according to the present invention. In the drawings, 51 denotes a low concentration p-type anode diffusion layer (third diffusion layer). The rest of the constitution is the same as illustrated in FIGS. 8.

Figure 9A:
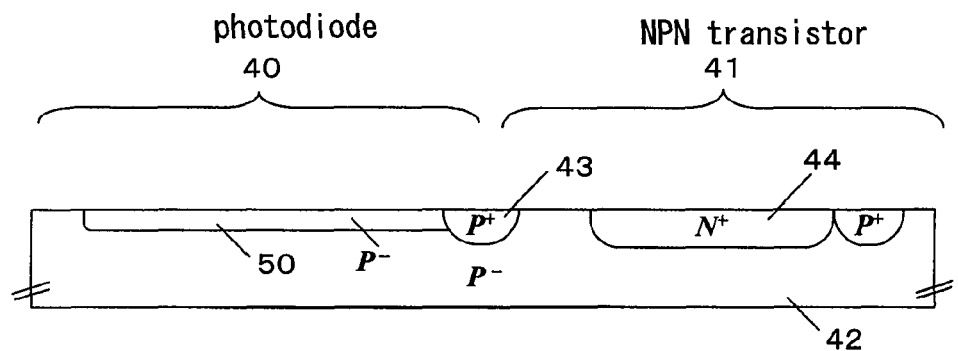
FIG. 9A is a process sectional view illustrating a method of manufacturing the optical semiconductor device according to the preferred embodiment 3.
Figure 9B:
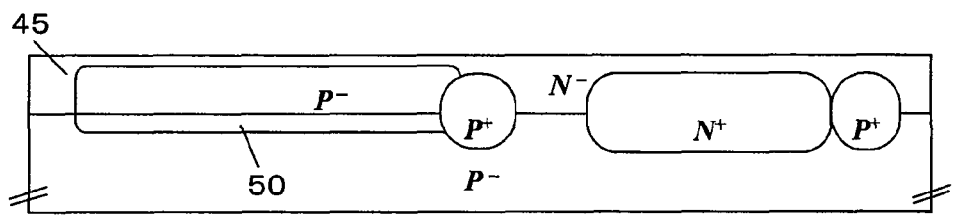
FIG. 9B is a process sectional view illustrating the method of manufacturing the optical semiconductor device according to the preferred embodiment 3.
Figure 9C:
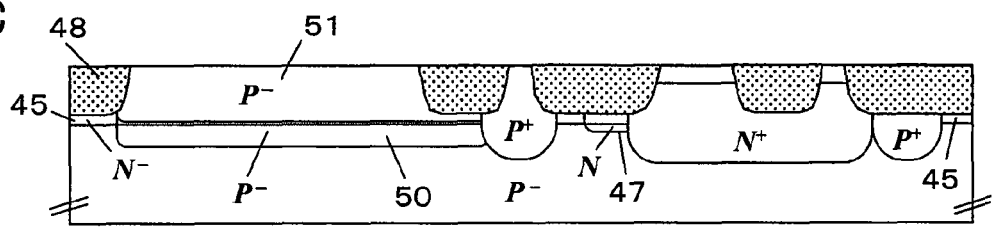
FIG. 9C is a process sectional view illustrating the method of manufacturing the optical semiconductor device according to the preferred embodiment 3.

First, the p-type embedding layer 43, n-type embedding layer 44 and anode embedding layer (second embedding layer) 50 are selectively formed in the silicon substrate 42 by means of the ion implantation or the like (FIG. 9A). In the formation, conditions are set so that the anode embedding layer (second embedding layer) 50 has its dopant concentration peak in the vicinity of the surface of the silicon substrate 42 (for example, acceleration energy: 30 keV, dosing amount: $1\times10^{11}$ cm$^{-2}$).

Next, the n-type epitaxial layer (second epitaxial layer) 45 (for example, film thickness: 1 µm, concentration: $5\times10^{14}$ cm$^{-3}$) is grown on the silicon substrate 42 (see FIG. 9B).

Next, the anode diffusion layer (third diffusion layer) 51 is selectively formed in the region of the photodiode 40 in the n-type epitaxial layer (second epitaxial layer) 45 so that the anode diffusion layer 51 has its dopant concentration thereof in the vicinity of the surface of the n-type epitaxial layer (second epitaxial layer) 45 and is connected to the anode embedding layer (second embedding layer) 50 by means of the ion implantation or the like (for example, acceleration energy: 30 keV, dosing amount: $1\times10^{11}$ cm$^{-2}$). Further, the n-type well layer 47 is selectively formed in the region of the NPN transistor 41 by means of the ion implantation or the like. After that, the LOCOS isolation layer 48 is formed (see FIG. 9C).

Figure 9D:
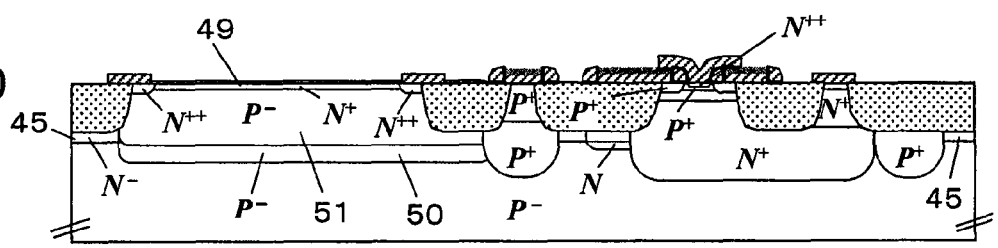
FIG. 9D is a process sectional view illustrating the method of manufacturing the optical semiconductor device according to the preferred embodiment 3.

Further, the cathode layer (second diffusion layer) 49 and the base/emitter diffusion layer of the NPN transistor 41 are formed on the anode diffusion layer (third diffusion layer) 51, and on the n-type layer 47, respectively (see FIG. 9D).

Figure 9E:
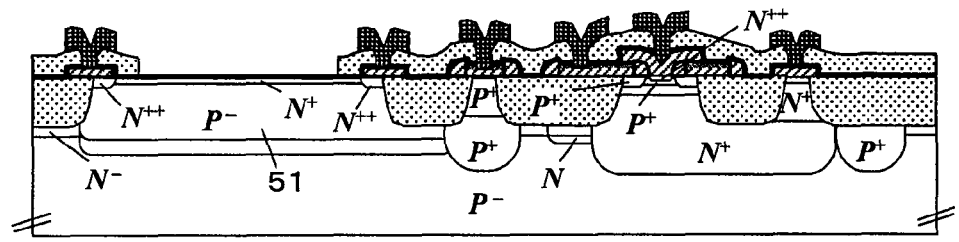
FIG. 9E is a process sectional view illustrating the method of manufacturing the optical semiconductor device according to the preferred embodiment 3.

Finally, filed films and electrodes are formed so that the photodiode 40 and the NPN transistor 41 are formed (see FIG. 9E).

The processing steps described so far can be summarized as below.

The method for manufacturing the optical semiconductor device according to the preferred embodiment 1 or 2 further comprises e) a step for selectively forming the third diffusion layer 51 of the first conductive type (p-type) having its dopant concentration peak on the surface of the second epitaxial layer 45 at an upper section of the first diffusion layer 45 or the second embedding layer 50 between the steps b) and c).

Preferred Embodiment 4 of Method for
Manufacturing Optical Semiconductor Device

FIGS. 10A-10E are sectional views illustrating processing steps of a preferred embodiment 4 of the method for manufacturing the optical semiconductor device according to the present invention. In the drawings, 52 denotes a high concentration p-type embedding layer (first embedding layer), and 53 denotes a low concentration p-type epitaxial layer (first epitaxial layer). The rest of the constitution is the same as illustrated in FIGS. 7.

Figure 10A:
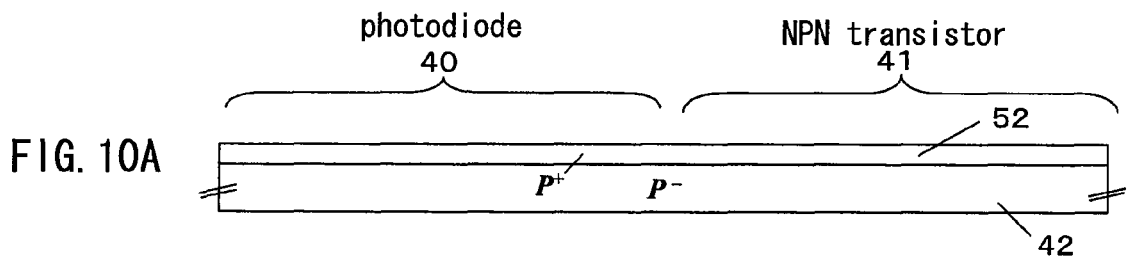
FIG. 10A is a process sectional view illustrating a method of manufacturing an optical semiconductor device according to a preferred embodiment 4 of the present invention.
Figure 10B:
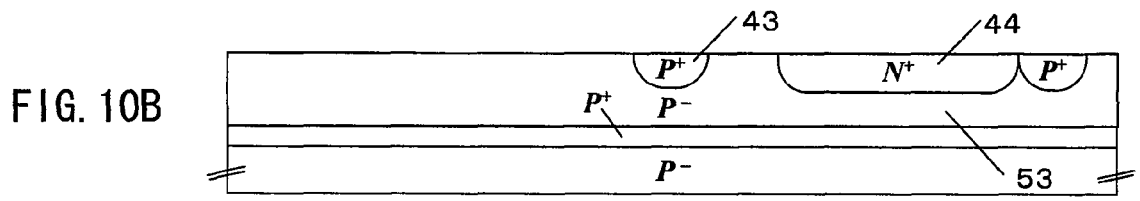
FIG. 10B is a process sectional view illustrating the method of manufacturing the optical semiconductor device according to the preferred embodiment 4.
Figure 10C:
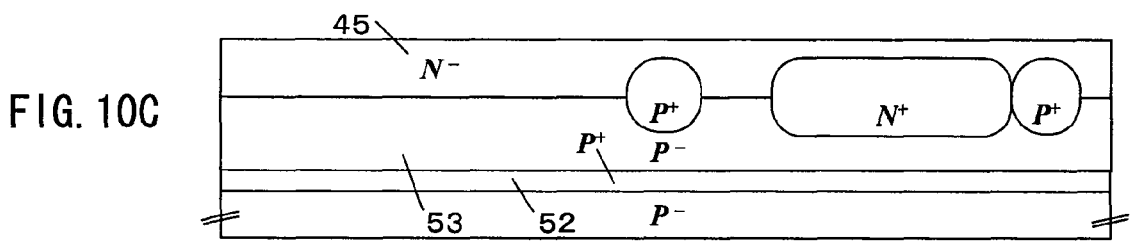
FIG. 10C is a process sectional view illustrating the method of manufacturing the optical semiconductor device according to the preferred embodiment 4.
Figure 10D:
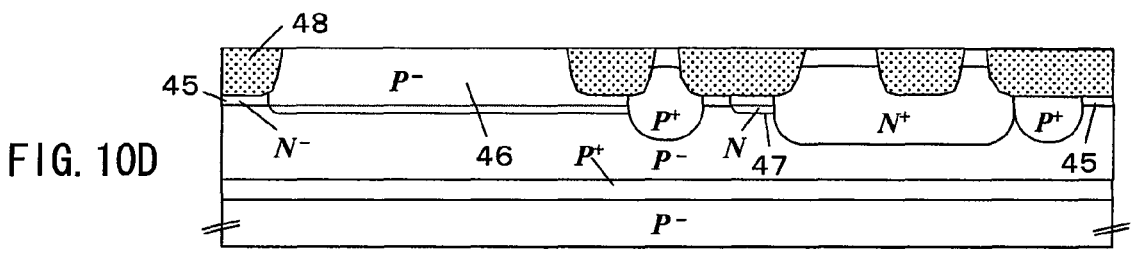
FIG. 10D is a process sectional view illustrating the method of manufacturing the optical semiconductor device according to the preferred embodiment 4.

First, the p-type embedding layer (first embedding layer) 52 is formed in the silicon substrate 42 by means of the ion implantation or the like, and the p-type epitaxial layer (first epitaxial layer) 53 is thereafter grown (see FIGS. 10A and 10B).

Next, the p-type embedding layer 43 and the n-type embedding layer 44 are selectively formed in the p-type epitaxial layer 53 by means of the ion implantation or the like (see FIG. 10B).

Then, the n-type epitaxial layer (second epitaxial layer) 45 (for example, film thickness: 1 µm, concentration: $5\times10^{14}$ cm$^{-3}$) is grown on the p-type epitaxial layer (first epitaxial layer) 53 (see FIG. 10C). When the n-type epitaxial layer 45 is grown, a thin film (for example, approximately 0.2 µm) is formed, and the supply of silane-based material gas is then halted so that the formed thin film is retained as it is, or the formed thin film is once taken out of an epitaxial oven. Then, the remaining film thickness portion of the epitaxial layer 45 (for example, approximately 0.8 µm) is grown again (so-called capping epitaxial growth). In this case, the auto doping from the embedding layer can be reduced more.

Then, in the n-type epitaxial layer (second epitaxial layer) 45, the p-type anode diffusion layer (first diffusion layer) 46 and the n-type well layer 47 are selectively formed in the region of the photodiode 40 and in the region of the NPN transistor 41, respectively. After that, the LOCOS isolation layer 48 is formed (see FIG. 10D).

Figure 10E:
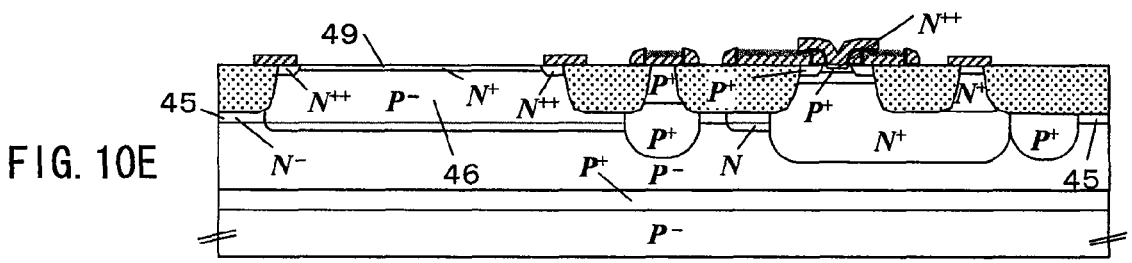
FIG. 10E is a process sectional view illustrating the method of manufacturing the optical semiconductor device according to the preferred embodiment 4.
Figure 10F:
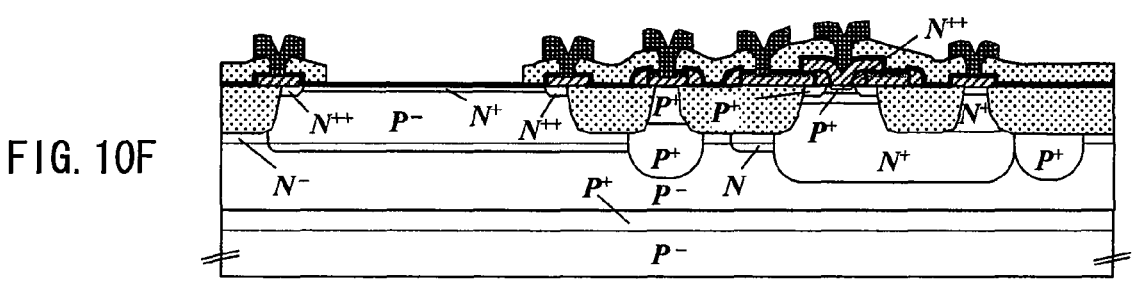
FIG. 10F is a process sectional view illustrating the method of manufacturing the optical semiconductor device according to the preferred embodiment 4.

Further, the cathode layer (second diffusion layer) 49 and the base/emitter diffusion layer of the NPN transistor 41 are formed on the anode diffusion layer (first diffusion layer) 46, and on the n-type layer 47, respectively (see FIG. 10E). Finally, field films and electrodes are formed so that the photodiode 40 and the NPN transistor 41 are formed (see FIG. 10F).

Below is given the summary of the processing steps described so far.

The method for manufacturing the optical semiconductor device according to the preferred embodiment 1, 2 or 3 further comprises f1) a step for forming the first embedding layer 52 of the first conductive type (p-type) having a high dopant concentration at an upper section of the semiconductor substrate 42 and f2) a step for forming the first epitaxial layer 53 of the first conductivity type (p-type) having a low dopant concentration on the first embedding layer 52 before the step a).

In the present preferred embodiments, the silicon substrate is adopted. However, the substrate to be used is not necessarily limited thereto, and a germanium substrate or a compound substrate, which is used in a long wavelength region, for example, may be used.

In the present invention, the pin photodiode is used as the light receiving element; however, it is needless to say that an avalanche photodiode or a phototransistor can be selected. Further, it is needless to say that the NPN transistor adopted as the transistor in this specification can be replaced with a PNP transistor or an MOS transistor.

In the present invention, the semiconductor substrate and the first epitaxial layer are of p-type; however, may naturally be of n-type.

INDUSTRIAL APPLICABILITY

The present invention is useful to a so-called OEIC in which a transistor characterized in its high speed and high performance and a light receiving element characterized in it high speed and high light receiving sensitivity are integrated on the same substrate.

What is claimed is:

1. An optical semiconductor device provided with a light receiving element and a transistor on the same substrate, the optical semiconductor device comprising:
   an epitaxial layer of a second conductivity type having a first dopant concentration formed on a semiconductor substrate of a first conductivity type;
   a first diffusion layer of the first conductivity type having a second dopant concentration selectively formed in the epitaxial layer and the semiconductor substrate in an area of the light receiving element, the first diffusion layer having its dopant concentration peak in the interface between the semiconductor substrate and the epitaxial layer; and
   a second diffusion layer of the second conductivity type having a third dopant concentration higher than the first dopant concentration formed at an upper section of the first diffusion layer, wherein
   the first and second diffusion layers constitute the light receiving element, and the transistor is formed in the epitaxial layer.

2. The optical semiconductor device as claimed in claim 1, further comprising a well layer of the second conductivity type selectively formed in the epitaxial layer, wherein the transistor is formed in the well layer.

3. The optical semiconductor device as claimed in claim 1, further comprising a well layer of the first conductivity type selectively formed in the epitaxial layer, wherein the transistor is formed in the well layer.

4. The optical semiconductor device as claimed in claim 1, further comprising a third diffusion layer of the first conductivity type having its dopant concentration peak on a surface of the epitaxial layer at an upper section of the first diffusion layer.

5. A method for manufacturing an optical semiconductor device provided with a light receiving element and a transistor on the same substrate, the method comprising:
   a) a step for forming an epitaxial layer of a second conductivity type having a first dopant concentration on a semiconductor substrate of a first conductivity type;
   b) a step for selectively forming a first diffusion layer of the first conductivity type having a second dopant concentration in the epitaxial layer and the semiconductor substrate in an area of the light receiving element by means of ion implantation so that the first diffusion layer has its dopant concentration peak in the interface between the semiconductor substrate and the epitaxial layer;
   c) a step for forming a second diffusion layer of the second conductivity type having a third dopant concentration higher than the first dopant concentration at an upper section of the first diffusion layer; and
   d) a step for selectively forming the transistor in the epitaxial layer, wherein
   the first and second diffusion layers constitute the light receiving element.

6. The method for manufacturing the optical semiconductor device as claimed in claim 5, further including, between the steps b) and c),
   e) a step for selectively forming a third diffusion layer of the first conductive type having its dopant concentration peak on a surface of the epitaxial layer at an upper section of the first diffusion layer.

7. The method for manufacturing the optical semiconductor device as claimed in claim 5, wherein
   the epitaxial layer is grown in two different stages.

* * * * *